United States Patent
Karino et al.

(10) Patent No.: US 9,711,659 B2
(45) Date of Patent: Jul. 18, 2017

(54) SEMICONDUCTOR DEVICE

(71) Applicant: FUJI ELECTRIC CO., LTD., Kawasaki-shi (JP)

(72) Inventors: Taichi Karino, Matsumoto (JP); Masaru Saito, Matsumoto (JP); Masaharu Yamaji, Matsumoto (JP); Osamu Sasaki, Azumino (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/875,654

(22) Filed: Oct. 5, 2015

(65) Prior Publication Data
US 2016/0133704 A1 May 12, 2016

(30) Foreign Application Priority Data

Nov. 12, 2014 (JP) ................................. 2014-229696

(51) Int. Cl.
*H01L 29/808* (2006.01)
*H01L 27/085* (2006.01)
*H02M 3/335* (2006.01)

(52) U.S. Cl.
CPC .......... *H01L 29/808* (2013.01); *H01L 27/085* (2013.01); *H02M 3/33523* (2013.01)

(58) Field of Classification Search
CPC ............... H01L 29/808; H01L 29/1066; H01L 29/7392; H01L 27/098; H01L 29/1058; H01L 2924/13062; H01L 27/14679
See application file for complete search history.

(56) References Cited

U.S. PATENT DOCUMENTS

| 8,786,021 B2* | 7/2014 | Chan ................... H01L 27/0629 257/355 |
| 2008/0117653 A1 | 5/2008 | Saito |
| 2010/0232081 A1* | 9/2010 | Disney ................ H01L 27/0266 361/91.5 |

FOREIGN PATENT DOCUMENTS

JP 2008-153636 A 7/2008

* cited by examiner

*Primary Examiner* — Jose R Diaz
(74) *Attorney, Agent, or Firm* — Rabin & Berdo, P.C.

(57) ABSTRACT

A semiconductor device includes a first conductive type first main electrode region, a first conductive type drift region which makes contact with the first main electrode region, a first conductive type second main electrode region which makes contact with the drift region, a second conductive type well region which is provided in a part of a surface layer portion of the drift region and to which a reference potential is applied, and a first conductive type potential extracting region which is provided in a surface layer portion of the well region and to which the reference potential is applied. The well region serves as a base region which controls a current flowing between the potential extracting region and the drift region. Thus, it is possible to provide a novel semiconductor device which is high in reliability while the increase of the chip size can be suppressed.

9 Claims, 14 Drawing Sheets

SEMICONDUCTOR DEVICE

CROSS-REFERENCE TO RELATED APPLICATION

This application is based on, and claims priority to, Japanese Patent Application No. 2014-229696, filed on Nov. 12, 2014, the contents of which are entirely incorporated herein by reference.

BACKGROUND OF THE INVENTION

1. Field of the Invention

The present invention relates to a semiconductor device. Particularly, it relates to a semiconductor device provided with a startup element.

2. Description of the Background Art

A switching power supply control IC which controls an individual high breakdown voltage switching transistor has been disclosed as a semiconductor device, for example, in JP-A-2008-153636. When the IC is operating, the IC operates the high breakdown voltage switching transistor to thereby form its own power supply. However, when the IC is started up, a startup current must be supplied thereto from a startup circuit. The startup circuit is usually integrated in the same semiconductor substrate as the switching power supply IC. With this configuration, it is possible to reduce the number of components and simplify the power supply system.

The startup current is a current formed by rectifying an input AC signal of AC 100 V to 240V. In order to supply the startup current to the startup circuit, an upstream normally-on type startup element of the startup circuit requires a breakdown voltage not lower than 450 V. The normally-on type startup element is made monolithic with the switching power supply control IC so as to be implemented as a lateral type high breakdown voltage junction field effect transistor (JFET). Design specifications of the switching power supply apparatus are determined based on the current driving capability of the JFET.

Further improvement of the reliability is also requested in the switching power supply control IC. Improvement of breakdown resistance to electrostatic discharge (ESD) of the JFET is important for improvement of the reliability of the switching power supply control IC. However, an external input terminal (bonding pad) electrically connected to a drain region of the JFET is provided on the JFET in this kind of switching power supply control IC. Therefore, it is difficult to form an ESD protection element in parallel with the JFET. For this reason, the JFET itself has to ensure the breakdown resistance to ESD. So far, there has been used a method in which the planar size of the JFET is increased and the distance between the external input terminal and a source region of the JFET, that is, the length of a drift region, in the planar pattern is elongated to improve the breakdown resistance to ESD. However, the chip size in this method becomes large. Therefore, an acquisition rate of chips which can be obtained from one piece of semiconductor wafer is decreased to thereby result in the increase of the cost.

SUMMARY OF THE INVENTION

An object of the invention is to provide a novel semiconductor device which is high in reliability while the increase of the chip size can be suppressed.

In order to achieve the foregoing object, a configuration of the invention is to provide a semiconductor device including: a first conductive type first main electrode region; a first conductive type drift region which makes contact with the first main electrode region; a first conductive type second main electrode region which makes contact with a peripheral portion of the drift region; a second conductive type well region which is provided in a part of a surface layer portion of the drift region and to which a reference potential is applied; and a first conductive type potential extracting region which is provided in a surface layer portion of the well region and to which the reference potential is applied; wherein: the well region serves as a base region which controls a current flowing between the potential extracting region and the drift region.

In addition, another configuration of the invention is to provide a semiconductor device including: a first conductive type first main electrode region; a first conductive type drift region which makes contact with the first main electrode region; a first conductive type second main electrode region which makes contact with the drift region; a second conductive type well region which is provided in a part of a surface layer portion of the second main electrode region and to which a reference potential is applied; and a first conductive type potential extracting region which is provided in a surface layer portion of the well region and to which the reference potential is applied; wherein: the well region serves as a base region which controls a current flowing between the potential extracting region and the second main electrode region.

According to the invention, it is possible to provide a novel semiconductor device which is high in reliability while the increase of the chip size can be suppressed.

DETAILED DESCRIPTION OF THE INVENTION

Semiconductor devices according to embodiments of the invention will be described below with reference to the drawings.

In the description, a "main electrode region" means a low specific resistance semiconductor region serving as one of a source region and a drain region in a field effect transistor (FET). More specifically, when the "semiconductor region serving as one" is defined as a "first main electrode region", a "semiconductor region serving as the other" is defined as a "second main electrode region". That is, the "second main electrode region" means a semiconductor region serving as the other of the source region and the drain region than the first main electrode region in the FET or static induction transistor (SIT). In the following first and second embodiments, each JFET will be described as a high breakdown voltage active element.

Although the case where a first conductive type is a p type and a second conductive type is an n type will be illustratively described in the following description of the first and second embodiments, these conductive types may be selected in a reverse relation in which the first conductive type is the n type and the second conductive type is the p type.

In addition, in the specification and the accompanying drawings, layers or regions prefixed with n or p mean that electrons or holes are majority carriers in the layers or regions. In addition, semiconductor regions prefixed with n or p added with + or − mean semiconductor regions with higher or lower impurity concentrations than semiconductor regions prefixed with n or p added without + or −.

Incidentally, in the following description of the first and second embodiments and the accompanying drawings, constituents similar to each other are referred to by the same symbols and duplicate description thereof will be omitted. In addition, the accompanying drawings which will be described in the first and second embodiments are not made with accurate scales or dimensions in order to make it easy to see or understand. It should be noted that the invention is not limited to the following statement of the first and second embodiments but any change may be made as long as it does not depart from the spirit and scope of the invention.

First Embodiment

<Switching Power Supply Apparatus>

Before a semiconductor device 31A according to a first embodiment of the invention will be described, a switching power supply apparatus using the semiconductor device 31A will be described.

Figure 6:
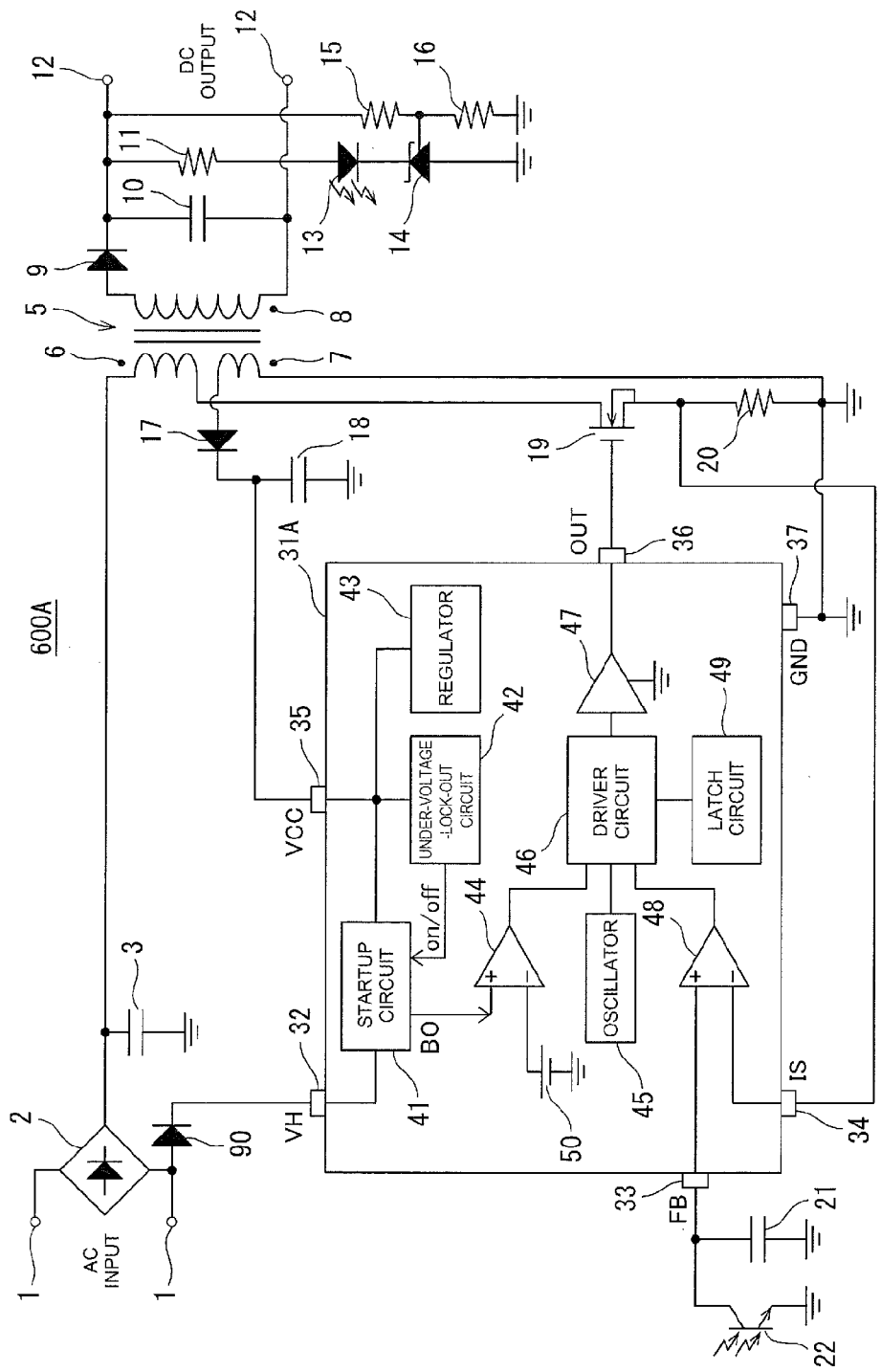
FIG. 6 is a circuit diagram schematically showing the configuration of a switching power supply apparatus provided with the semiconductor device according to the first embodiment of the invention.

A switching power supply apparatus 600A shown in FIG. 6 is provided with the semiconductor device (control IC) 31A according to the first embodiment of the invention. The semiconductor device 31A according to the first embodiment has a VH terminal (high breakdown voltage input terminal) 32 to which, for example, a voltage of from about several tens of V to about 500 V is applied, a feedback input terminal (hereinafter referred to as FB terminal) 33, a current sense input terminal (hereinafter referred to as IS terminal) 34, a power supply voltage terminal (hereinafter referred to as VCC terminal) 35 for the control IC 31A, a gate drive terminal (hereinafter referred to as OUT terminal) 36 for an MOSFET 19, and a ground terminal (hereinafter referred to as GND terminal) 37. The VH terminal 32 is a terminal which supplies a current to the VCC terminal 35 when a power supply starts up. In the first embodiment, a voltage in which an AC input voltage has been rectified and smoothed is applied to the VH terminal 32. The GND terminal 37 is grounded.

The AC input is supplied to a rectifier 2 through an AC input terminal pair (ports) 1. The rectifier 2 is connected to the AC input terminal pair 1 to rectify the full waves of the AC input. A power supply capacitor 3 is connected in parallel with an output terminal of the rectifier 2 to be thereby charged with a DC voltage outputted from the rectifier 2. The charged power supply capacitor 3 serves as a DC power supply which supplies a DC voltage to a primary coil 6 of a transformer 5. In addition, the VH terminal 32 of the control IC 31A is connected to the power supply capacitor 3.

The primary coil 6 is connected between the power supply capacitor 3 and a drain terminal of the MOSFET 19 serving as a switching element. A source terminal of the MOSFET 19 is connected to the IS terminal 34 of the semiconductor device 31A and one end of a resistor 20. The other end of the resistor 20 is grounded. A current flowing into the MOSFET 19 is converted into a voltage by the resistor 20. The converted voltage is applied to the IS terminal 34. A gate terminal of the MOSFET 19 is connected to the OUT terminal 36 of the control IC 31A.

One end of an auxiliary coil 7 of the transformer 5 is connected in parallel with an anode terminal of a rectifier diode 17. The other end of the auxiliary coil 7 is grounded. A current induced by a switching operation of the MOSFET 19 flows into the auxiliary coil 7. The rectifier diode 17 rectifies the current flowing into the auxiliary coil 7 and charges a smoothing capacitor 18 connected to a cathode terminal of the rectifier diode 17. The smoothing capacitor 18 is connected to the VCC terminal 35 of the control IC 31A and serves as a DC power supply for continuing the switching operation of the MOSFET 19.

A voltage based on the voltage of the power supply capacitor 3 is induced in a secondary coil 8 of the transformer 5 by the switching operation of the MOSFET 19. One end of the secondary coil 8 is connected to an anode terminal of a rectifier diode 9. A cathode terminal of the rectifier diode 9 and the other end of the secondary coil 8 are connected to a DC output terminal pair (ports) 12. In addition, a smoothing capacitor 10 is connected between the cathode terminal of the rectifier diode 9 and the other end of the secondary coil 8. The rectifier diode 9 rectifies the current flowing into the secondary coil 8 to charge the smoothing capacitor 10. The charged smoothing capacitor 10 supplies a direct-current output (DC output) controlled to be a desired DC voltage value, to a not-shown load connected to the DC output terminal pair 12.

In addition, a series resistor circuit including two resistors 15 and 16 and one end of a resistor 11 are connected to the anode terminal of the rectifier diode 9 and one connection node of the DC output terminal pair 12. The other end of the resistor 11 is connected to an anode terminal of a photodiode 13 constituting a photocoupler. A cathode terminal of the photodiode 13 is connected to a cathode terminal of a shunt regulator 14. An anode terminal of the shunt regulator 14 is grounded. These resistors 11, 15 and 16, the photodiode 13, and the shunt regulator 14 constitute a voltage detection/feedback circuit which detects a DC output voltage between opposite ends of the smoothing capacitor 10 and adjusts the DC output voltage.

An optical signal is outputted from the photodiode 13 so that the DC output voltage between the opposite ends of the smoothing capacitor 10 can be adjusted to a predetermined DC voltage value based on a set value in the shunt regulator 14. The optical signal which is received by a phototransistor 22 constituting the photocoupler together with the photodiode 13 serves as a feedback signal to the control IC 31A. The phototransistor 22 is connected to the FB terminal 33 of the semiconductor device 31A. The feedback signal is inputted to the FB terminal 33. In addition, a capacitor 21 is connected to the phototransistor 22. The capacitor 21 serves as a noise filter for filtering the feedback signal.

As shown in FIG. 6, the semiconductor device 31A according to the first embodiment is provided with a startup circuit 41, an under-voltage-lock-out (UVLO) circuit 42, a regulator 43, a BO comparator 44, an oscillator 45, a driver circuit 46, an output amplifier 47, a pulse width modulation (PWM) comparator 48, a latch circuit 49 and a reference power supply 50. The startup circuit 41 is connected to the VH terminal 32, the VCC terminal 35, and a non-inverting input terminal of the BO comparator 44. The startup circuit 41 supplies a current to the VCC terminal 35 when the power supply starts up.

The under-voltage-lock-out circuit 42 is connected to the VCC terminal 35 and the startup circuit 41. The under-voltage-lock-out circuit 42 stops the supply of the current from the startup circuit 41 to the VCC terminal 35 as soon as the voltage of the VCC terminal 35 rises to a voltage required for operating the semiconductor device 31A due to the current supplied from the startup circuit 41. A current is subsequently supplied to the VCC terminal 35 from the auxiliary coil 7. The regulator 43 is connected to the VCC terminal 35 and generates a reference voltage required for operating the respective portions of the semiconductor device 31A based on the voltage of the VCC terminal 35. After the power supply starts up, the semiconductor device 31A is driven by the reference voltage outputted from the regulator 43.

An inverting input terminal and a non-inverting input terminal of the PWM comparator 48 are connected to the IS terminal 34 and the FB terminal 33 respectively. The PWM comparator 48 inverts its output in accordance with the magnitude relation between the voltage of its inverting input terminal and the voltage of its non-inverting input terminal. The output of the PWM comparator 48 is inputted to the driver circuit 46.

The oscillator 45 is connected to the driver circuit 46 to which an oscillation signal is inputted from the oscillator 45. When a turn-on signal is inputted from the oscillator 45 to the driver circuit 46 and the voltage of the non-inverting input terminal of the PWM comparator 48 (i.e. the voltage of the FB terminal 33) is larger than the voltage of the inverting input terminal of the PWM comparator 48 (i.e. the voltage of the IS terminal 34), an output signal of the driver circuit 46 turns to a Hi state. The output amplifier 47 amplifies the Hi state signal outputted from the driver circuit 46 and drives the gate of the MOSFET 19 through the OUT terminal 36.

On the other hand, when the voltage of the inverting input terminal of the PWM comparator 48 is larger than the voltage of the non-inverting input terminal of the PWM comparator 48, the PWM comparator 48 inverts its output with a result that the output signal of the driver circuit 46 turns to a Low state. The output amplifier 47 amplifies the Low state signal outputted from the driver circuit 46 and supplies the amplified Low state signal to the gate of the MOSFET 19 through the OUT terminal 36. Accordingly, the MOSFET 19 turns off to thereby prevent the current from flowing into the MOSFET 19. In this manner, the threshold level of the PWM comparator 48 is changed in accordance with a secondary side output voltage to variably control the ON period of the MOSFET 19. Thus, the secondary side output voltage can be made stable.

In addition, an inverting input terminal of the BO comparator 44 is connected to the reference power supply 50. The BO comparator 44 inverts its output in accordance with the magnitude relation between the voltage of its non-inverting input terminal and the voltage of its inverting input terminal. A signal of a low voltage obtained by resistance voltage division with resistors inside the startup circuit 41 is inputted to the BO comparator 44 as will be described later. Accordingly, the BO comparator 44 can be constituted by a low breakdown voltage MOS. The output of the BO comparator 44 is inputted to the driver circuit 46.

Assume that the Hi state signal is being outputted from the driver circuit 46. When the voltage of the non-inverting input terminal of the BO comparator 44 is larger than the voltage of the inverting input terminal of the BO comparator 44 in this state, the output single of the driver circuit 46 is kept at the Hi state as it is. When the supply of the voltage from the AC input stops and a primary side input voltage drops, the voltage of the non-inverting input terminal of the BO comparator 44 becomes smaller than the voltage of the inverting input terminal of the BO comparator 44. Then, the output signal of the driver circuit 46 is inverted to the Low state. As a result, the switching operation of the MOSFET 19 stops but the brownout function thereof is activated.

The latch circuit 49 is connected to the driver circuit 46. When an abnormal state such as the rise of the secondary side output voltage, heating of the control IC 31A, or the drop of the secondary side output voltage is detected, the latch circuit 49 forcibly changes the output of the driver circuit 46 to the Low state for overvoltage protection, overheating protection or overcurrent protection to stop the supply of electric power to the secondary side output. This state is kept until the voltage of the VCC power supply drops and the control IC 31A is reset. Although not particularly limited, for example, elements constituting the respective circuits etc. of the control IC 31A are formed on the same semiconductor substrate.

<Startup Circuit>

Figure 7:
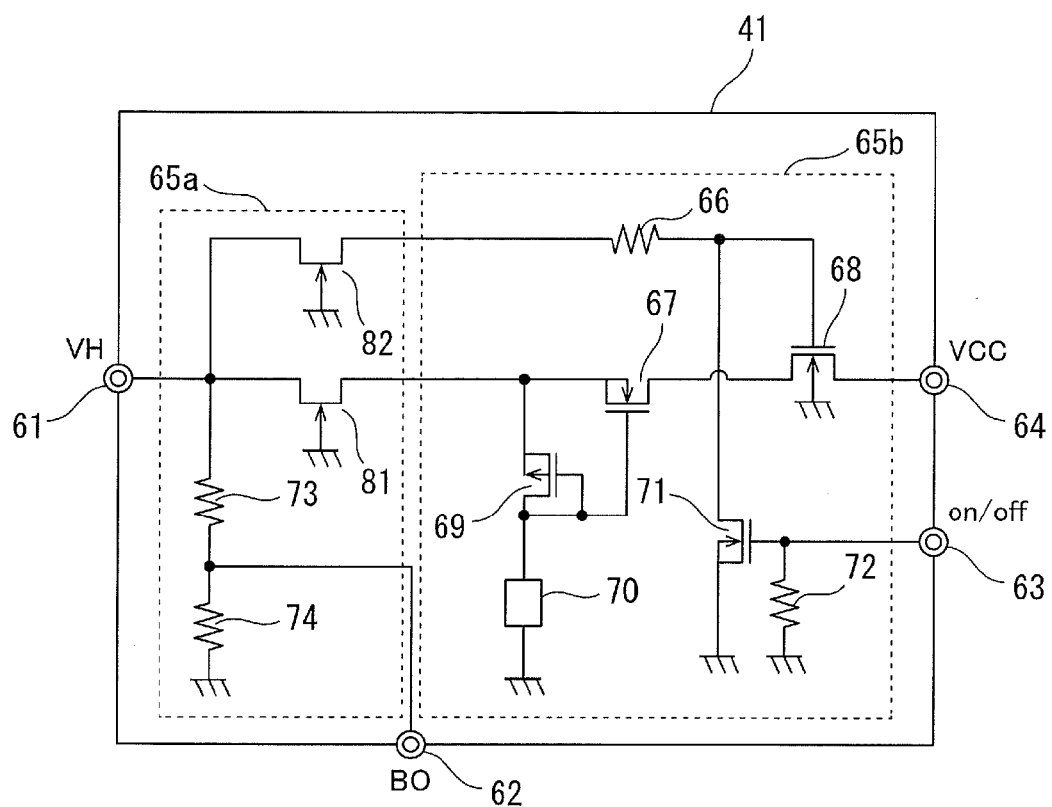
FIG. 7 is a circuit diagram schematically showing the configuration of a startup circuit in the semiconductor device shown in FIG. 4.

Next, the startup circuit 41 of the semiconductor device 31A according to the first embodiment will be described. As shown in FIG. 7, the startup circuit 41 is provided with a VH terminal (high breakdown voltage input terminal) 61, a BO terminal (BrownOut input terminal) 62, an on/off terminal (on/off signal input terminal) 63, and a VCC terminal (power supply voltage terminal) 64. The VH terminal 61 and the VCC terminal 64 are connected to the VH terminal 32 and the VCC terminal 35 of the control IC 31A respectively. The on/off terminal 63 is connected to the under-voltage-lock-out circuit 42.

In addition, the startup circuit 41 is provided with a startup element 65a and a startup posterior stage circuit 65b. For example, the startup element 65a is provided with two high breakdown voltage junction field effect transistors (a first JFET 81 and a second JFET 82) serving as active elements, and a series circuit consisting of two resistors (a first resistor 73 and a second resistor 74). The BO terminal 62 is connected to an intermediate node of the series circuit consisting of the first resistor 73 and the second resistor 74. The series circuit consisting of the first resistor 73 and the second resistor 74 is connected to the VH terminal 61. The first resistor 73 and the second resistor 74 are formed out of a resistive field plate 120 shown in FIG. 2.

The startup posterior stage circuit 65b is provided with a first PMOS transistor 67, a second PMOS transistor 69, a first NMOS transistor 68, a second NMOS transistor 71, a load 70 and a resistor 72.

In addition, the BO terminal 62 is connected to the non-inverting input terminal of the BO comparator 44. That is, a voltage obtained by resistance voltage division in which the input voltage to the VH terminal 61 is divided by the resistors 73 and 74 is inputted to the non-inverting input terminal of the BO comparator 44. The resistance value of each of the resistors 73 and 74 is not particularly limited but may be not lower than 1 MΩ. The upper limit of the resistance value of the resistor 73 or 74 is not particularly limited but may be not higher than the upper limit of the resistance value which can be provided inside the semiconductor device. For example, the upper limit of the resistance value of the resistor 73 or 74 is not higher than about 10 MΩ.

The first JFET 81 and the second JFET 82 are normally-on type junction field effect transistors. Gate terminals of the first JFET 81 and the second JFET 82 are grounded. In addition, drain terminals of the first JFET 81 and the second JFET 82 are connected to the VH terminal 61 in common. A source terminal of the first JFET 81 is connected to a source terminal of the first PMOS transistor 67 and a source terminal of the second PMOS transistor 69.

A gate terminal of the first PMOS transistor 67 is connected to a gate terminal and a drain terminal of the second PMOS transistor 69 in common. The drain terminal of the second PMOS transistor 69 is connected to the load 70. The first NMOS transistor 68 is connected between a drain terminal of the first PMOS transistor 67 and the VCC terminal 64.

A gate terminal of the first NMOS transistor 68 is connected to a source terminal of the second JFET 82 through a resistor 66. In addition, the gate terminal of the first NMOS transistor 68 is connected to a drain terminal of the second NMOS transistor 71. A gate terminal of the second NMOS transistor 71 is connected to the on/off terminal 63. A source terminal of the second NMOS transistor 71 is grounded. In addition, the gate terminal of the second NMOS transistor 71 is grounded through the resistor 72.

In the startup circuit 41 configured thus, a current flowing into the second PMOS transistor 69 is determined based on the voltage current characteristic of the second PMOS transistor 69 and the impedance of the load 70. The second PMOS transistor 69 and the first PMOS transistor 67 form a current mirror connection. The value W/L of the second PMOS transistor 69 is 1 whereas the value W/L of the first PMOS transistor 67 is 100. Accordingly, a current which is 100 times as high as the current flowing into the second PMOS transistor 69 flows into the first PMOS transistor 67. Incidentally, the symbols "W" and "L" designate channel width and channel length respectively.

The first NMOS transistor 68 serves as a switch which changes over between an on state and an off state based on an on/off signal supplied from the under-voltage-lock-out circuit 42 through the on/off terminal 63. When the on/off signal is in the Low state, the second NMOS transistor 71 turns to an off state and a high voltage is inputted to the gate terminal of the first NMOS transistor 68. Accordingly, the switch of the first NMOS transistor 68 turns on. When the switch turns on, a current is supplied to the VCC terminal 35 of the control IC 31A from the startup circuit 41 at the startup time of the aforementioned power supply.

On the other hand, when the on/off signal is in a Hi state, the second NMOS transistor 71 turns to an on state and the voltage at the gate of the first NMOS transistor 68 becomes zero. Accordingly, the switch of the first NMOS transistor 68 turns off. Accordingly, a current path between the VH terminal 61 and the VCC terminal 64 is blocked. As a result, the supply of the current from the startup circuit 41 to the VCC terminal 35 stops.

Incidentally, in some cases, the first JFET 81 and the second JFET 82 may be formed from one JEFT. For example, when the JFET is constituted by only the first JFET 81, the second JFET 82 can be dispensed with. It will go well as long as a wiring connected to the source of the second JEFT 82 and connected to the resistor 66 is connected to the source of the first JFET 81.

<Structure of Semiconductor Device>

Next, the specific structure of the semiconductor device 31A according to the first embodiment will be described with reference to FIGS. 1 to 5. Incidentally, illustration of upper layers than a field insulating film 110 which will be described later will be omitted in FIG. 3.

Figure 1:
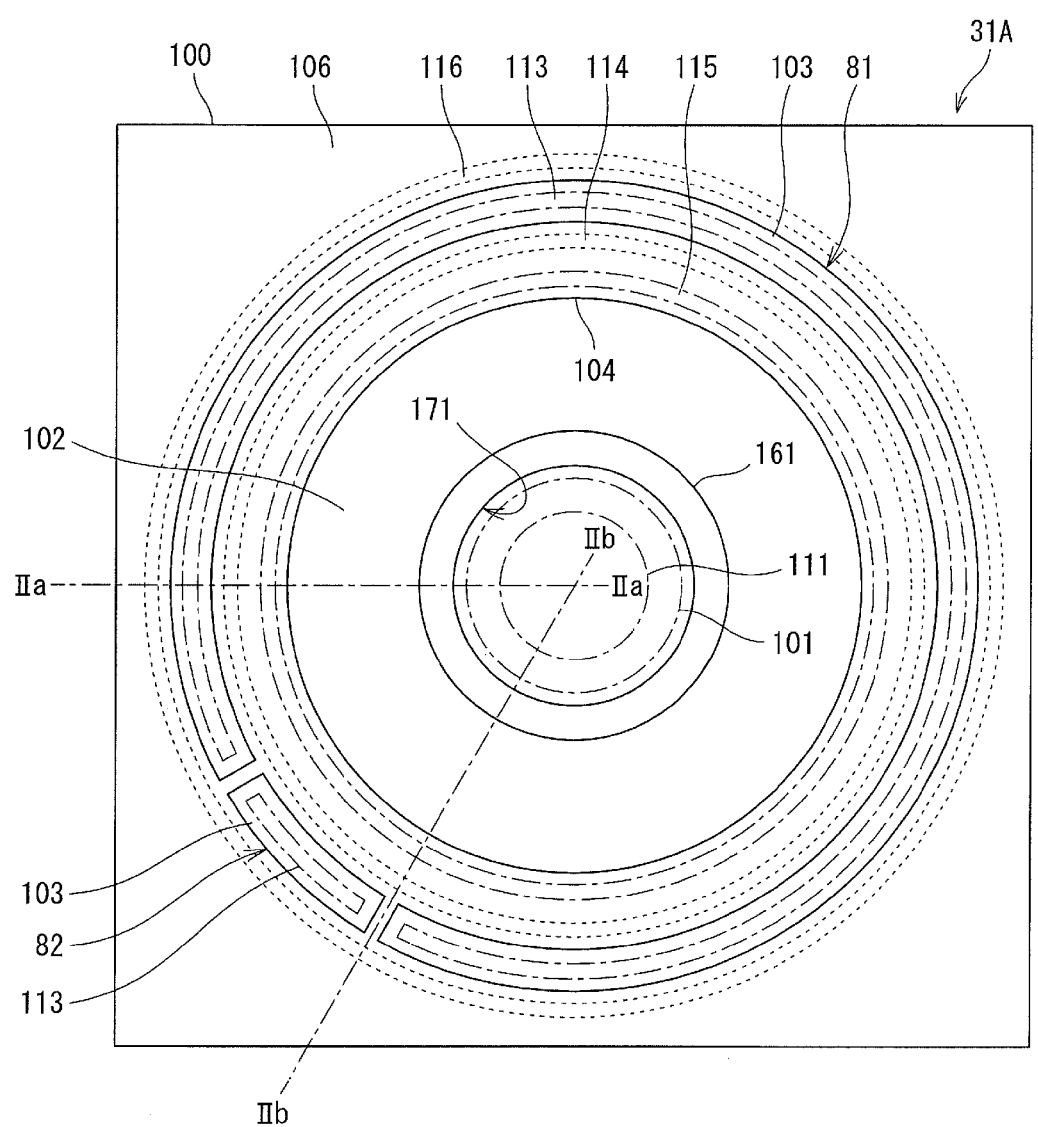
FIG. 1 is a main portion plan view schematically showing the configuration of a semiconductor device according to a first embodiment of the invention.
Figure 2:
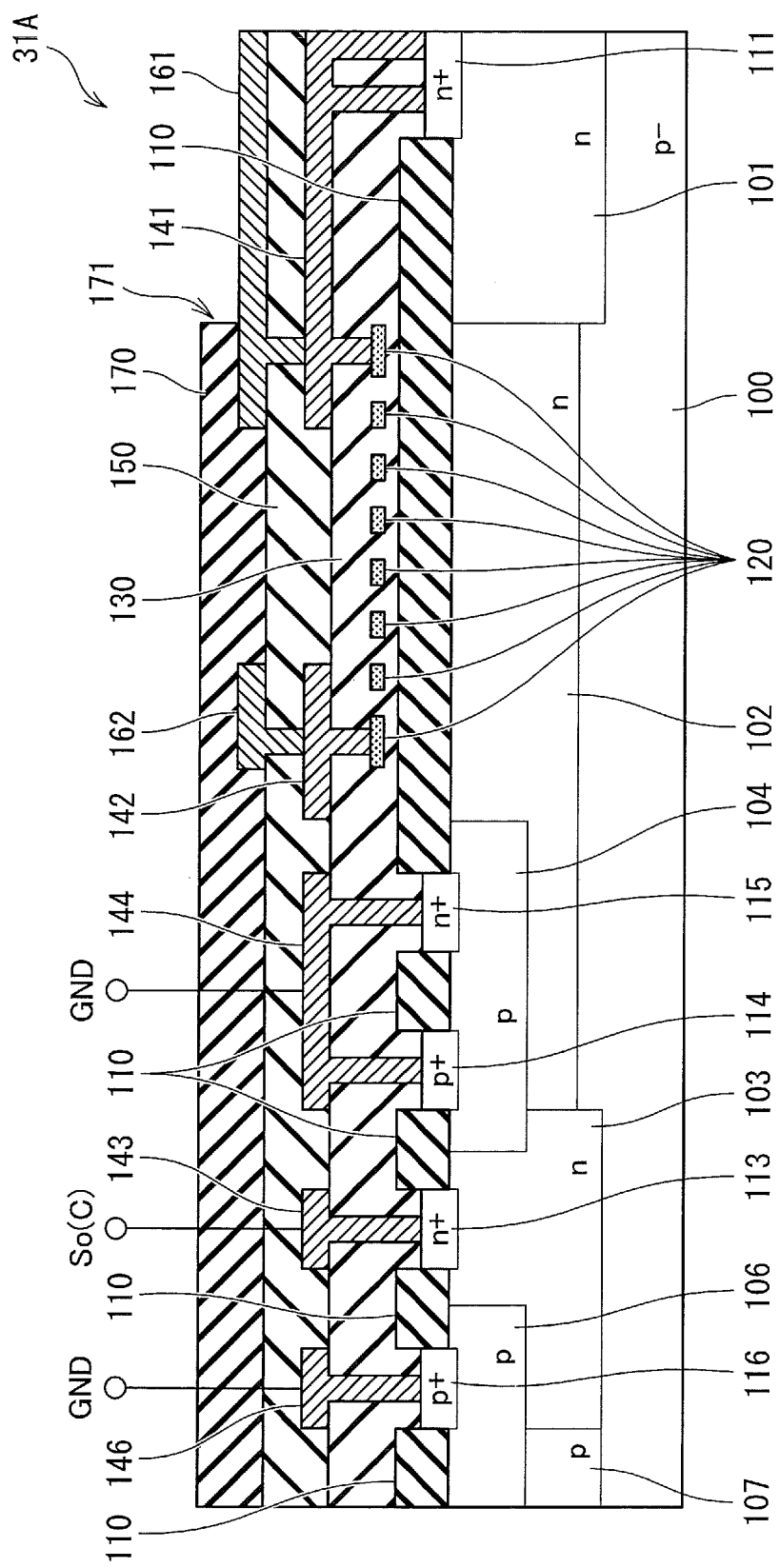
FIG. 2 is a sectional view showing the sectional structure taken along a line IIa-IIa in FIG. 1.

As shown in FIGS. 1 and 2, the semiconductor device 31A according to the first embodiment is mainly constituted by a second conductive type (p⁻ type) semiconductor substrate 100. The first JFET 81 and the second JFET 82 constituting parts of the startup circuit 41 shown in FIG. 7 are formed in main surface-side surface layer portions of the semiconductor substrate 100. For example, a monocrystalline silicon substrate is used as the semiconductor substrate 100. The first JFET 81 and the second JFET 82 have substantially the same configurations. Accordingly, description will be made in focus on the first JFET 81 while description about the second JFET 82 will be omitted.

As shown in FIGS. 1 and 2, the first JFET 81 has a first conductive type (n type) first main electrode region (drain region) 101 provided in the center of the semiconductor substrate 100. Although the first main electrode region 101 is illustrated in the right end in the sectional view of FIG. 2, the semiconductor device 31A according to the first embodiment is provided with the first main electrode region 101, a second conductive type (n type) drift region 102, and a first conductive type (n type) second main electrode region (source region) 103. In addition, as shown in FIG. 2, the first JFET 81 is provided with a second conductive type (p type) well region 104, a second conductive type (p type) substrate power-feeding well region 106, and a second conductive type (p type) embedded region 107. As shown in FIG. 1, the second main electrode region (source electrode) 103 is divided into two. Of the two, one part of the second main electrode region 103 belongs to the first JFET 81, and the other part of the second main electrode region 103 belongs to the second JFET 82.

As shown in FIG. 2, the first main electrode region 101 is provided in a main surface-side surface layer portion of the semiconductor substrate 100. As shown in FIGS. 1 and 2, the drift region 102 is provided in a main surface-side surface layer portion of the semiconductor substrate 100 so as to make contact with the first main electrode region 101 in a position surrounding the first main electrode region 101. In FIG. 2, the second main electrode region 103 is illustrated only in a place corresponding to the left half of FIG. 1. However, as apparent from FIG. 1, the second main electrode region 103 is provided in a main surface-side surface layer portion of the semiconductor substrate 100 so as to make contact with the drift region 102 in a position surrounding the drift region 102.

As shown in FIGS. 1 and 2, the well region 104 is provided in a surface layer portion of the drift region 102. The substrate power-feeding well region 106 is provided in a main surface-side surface layer portion of the semiconductor substrate 100 so as to be separated from the well region 104 in a position surrounding the well region 104. The embedded region 107 is provided between the substrate power-feeding well region 106 and the semiconductor substrate 100 so as to make contact with the substrate power-feeding well region 106 and the semiconductor substrate 100.

As shown in FIGS. 1 and 2, the first JFET 81 is provided with a first conductive type ($n^+$ type) first main electrode contact region 111 selectively provided in a surface layer portion of the first main electrode region 101, a first conductive type ($n^+$ type) second main electrode contact region 113 selectively provided in a surface layer portion of the second main electrode region 103, a second conductive type ($p^+$ type) well contact region 114 and a first conductive type ($n^+$ type) potential extracting region 115 selectively provided in surface layer portions of the well region 104, and a second conductive type ($p^+$ type) substrate power-feeding well contact region 116 selectively provided in a surface layer portion of the substrate power-feeding well region 106.

The first main electrode contact region 111 is formed with a higher impurity concentration than that of the first main electrode region 101. The second main electrode contact region 113 is formed with a higher impurity concentration than that of the second main electrode region 103. Each of the well contact region 114 and the potential extracting region 115 is formed with a higher impurity concentration than that of the well region 104. The substrate power-feeding well contact region 116 is formed with a higher impurity concentration than that of the substrate power-feeding well region 106. The drift region 102 is formed with a lower impurity concentration than that of each of the first main electrode region 101 and the second main electrode region 103.

As shown in FIG. 1, each of the second main electrode contact region 113, the well contact region 114, the potential extracting region 115 and the substrate power-feeding well contact region 116 is formed annularly in a position surrounding the first main electrode region 101. In addition, each of the drift region 102, the second main electrode region 103 and the well region 104 is formed annularly in a position surrounding the first main electrode region 101.

As shown in FIG. 2, the well region 104 is formed to extend from the drift region 102 onto the second main electrode region 103. In addition, the well region 104 is formed to be shallower than the drift region 102 and the second main electrode region 103. Moreover, a part of the substrate power-feeding well region 106 is formed in a surface layer portion of the second main electrode region 103. In addition, the substrate power-feeding well region 106 is formed to be shallower than the second main electrode region. The drift region 102 is formed between the first main electrode region 101 and the second main electrode region 103 so as to make contact with the first main electrode region 101 and the second main electrode region 103. In addition, the drift region 102 is formed to be shallower than the first main electrode region 101 and the second main electrode region 103.

As shown in FIG. 1, each of the second main electrode region 103 and the second main electrode contact region 113 is divided into two. The substrate power-feeding well region 106 and the embedded region 107 are formed in the outside of the well region 104 so as to surround the well region 104.

Figure 3:
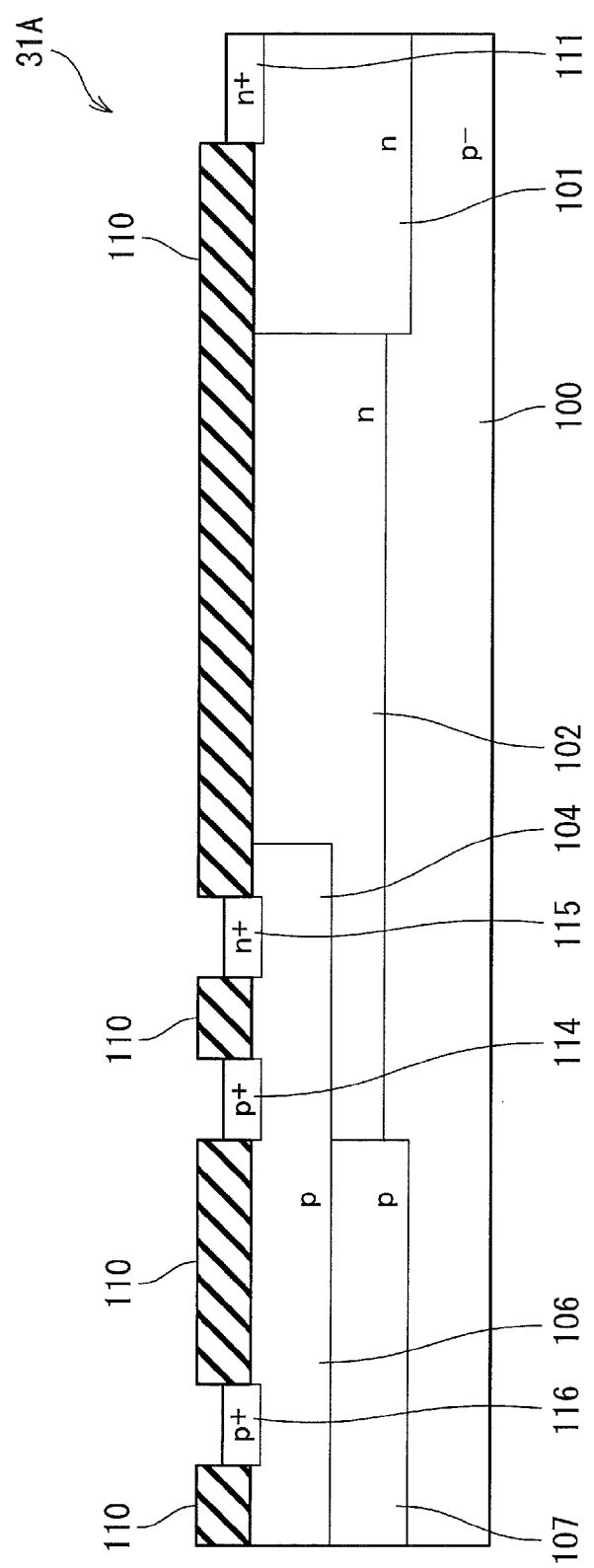
FIG. 3 is a sectional view showing the sectional structure taken along a line IIb-IIb in FIG. 1.

As shown in FIGS. 1 and 3, the substrate power-feeding well region 106 is consecutively connected to the well region 104 through notches of the second main electrode region 103 and the second main electrode contact region 113 so as to be electrically connected to the well region 104. The substrate power-feeding well region 106 and the well region 104 are formed collectively with the same mask pattern in an impurity introducing step in a semiconductor device manufacturing process.

As shown in FIG. 2, a field insulating film 110 which is, for example, made of a silicon dioxide film is selectively formed in the main surface of the semiconductor substrate 100. In addition, a first interlayer insulating film 130 which is, for example, made of a silicon dioxide film is provided on the main surface of the semiconductor substrate 100 so as to cover the field insulating film 110. A resistive field plate 120 is provided inside the first interlayer insulating film 130. Although not shown in detail, the planar pattern of the resistive field plate 120 is formed into a spiral shape so as to surround the first main electrode region 101. The resistive field plate 120 is disposed on breakdown voltage regions of the first JFET 81 and the second JFET 82, i.e. on the drift region 102 with the interposition of the field insulating film 110 and a lower layer portion of the first interlayer insulating film 130 therebetween. Although not shown, the first resistor 73 and the second resistor 74 are formed in intermediate portions between one end side and the other end side of the resistive field plate 120. The first resistor 73 and the second resistor 74 are connected in series through an intermediate node wiring electrically connected to the BO terminal 62. For example, the resistive field plate 120 is made of a polycrystalline silicon film.

As shown in FIG. 2, a first main electrode wiring 141, a first intermediate wiring 142, a second main electrode wiring 143, a reference potential wiring 144, a substrate power-feeding wiring 146, etc. which are formed in a first metal wiring layer are provided on the first interlayer insulating film 130.

A second interlayer insulating film 150 which is, for example, made of a silicon dioxide film is provided on the first interlayer insulating film 130 so as to cover the first main electrode wiring 141, the first intermediate wiring 142, the second main electrode wiring 143, the reference potential wiring 144, the substrate power-feeding wiring 146, etc.

A bonding pad (external input terminal) 161, a second intermediate wiring 162, etc. which are formed in a second metal wiring layer are formed on the second interlayer insulating film 150. A protective film 170 which is, for example, made of a polyimide-based resin film is provided on the second interlayer insulating film 150 so as to cover the second intermediate wiring 162, etc. A bonding opening 171 is provided in the protective film 170 so as to expose the bonding pad 161. For example, each of the first metal wiring layer and the second metal wiring layer is made of an aluminum (Al) film, or an aluminum alloy film such as an aluminum-silicon (Al—Si) film, an aluminum-copper (Al—Cu) film or an aluminum-copper-silicon (Al—Cu—Si) film.

The first main electrode wiring 141 is electrically and metallically connected to the first main electrode contact region 111 through contact portions penetrating the first interlayer insulating film 130. In addition, the first main electrode wiring 141 is electrically and metallically connected to the one end side of the resistive field plate 120 through a contact portion penetrating the first interlayer insulating film 130. The bonding pad 161 is electrically and metallically connected to the first main electrode wiring 141 through a contact portion penetrating the second interlayer insulating film 150. That is, the first main electrode region (drain region) 101 is electrically connected to the bonding pad 161 to which a potential is applied from the outside. The bonding pad 161 is disposed on the first main electrode region 101.

The first intermediate wiring 142 is electrically and metallically connected to the other end side of the resistive field plate 120 through a contact portion penetrating the first interlayer insulating film 130. The second intermediate wiring 162 is electrically and metallically connected to the first intermediate wiring 142 through a contact portion penetrating the second interlayer insulating film 150.

The second main electrode wiring 143 is electrically and metallically connected to the second main electrode contact region 113 through a contact portion penetrating the first interlayer insulating film 130. The second main electrode wiring 143 is electrically connected to the startup posterior stage circuit 65b. That is, the second main electrode region 103 of the first JFET 81 is electrically connected to the startup posterior stage circuit 65b through the second main electrode wiring 143. In addition, the second main electrode region 103 of the second JFET 82 separated from the second main electrode region 103 of the first JFET 81 is also electrically connected to the startup posterior stage circuit 65b through the second main electrode wiring different from the second main electrode wiring 143.

The reference potential wiring 144 is electrically and metallically connected to the well contact region and the potential extracting region through contact portions penetrating the first interlayer insulating film 130. A ground potential is applied as a reference potential to the reference potential wiring 144. That is, the ground potential is applied to the well contact region 114 and the potential extracting region 115.

The substrate power-feeding wiring 146 is electrically and metallically connected to the substrate power-feeding well contact region 116 through a contact portion penetrating the first interlayer insulating film 130. A ground potential is applied as a reference potential to the substrate power-feeding wiring 146. That is, the ground potential is applied to the semiconductor substrate 100.

As shown in FIG. 2, in the first JFET 81 and the second JFET 82 (active element 65a), the junction between the well region 104 and the drift region 102 plays a role as the structure for increasing the breakdown voltage and the second main electrode region (source region) 103 in the peripheral portion plays a role as the structure for large current. Due to the role sharing, the first JFET 81 and the second JFET 82 can make the increase of the breakdown voltage and the reduction of the on-resistance compatible.

When a voltage is applied to the first main electrode region (drain region) 101, a drain current flows radially from the first main electrode region 101 shown in the center of FIG. 1 toward the second main electrode region 103. When the second main electrode region 103 is biased toward a positive potential and the potential increases and reaches a certain potential, the drift region 102 is cut off by a depletion layer so that the drain current can be blocked. In the first embodiment, for example, the breakdown voltage between the drain and the source is designed to be not lower than 500 V mainly due to the junction between the well region 104 and the drift region 102.

Figure 4:
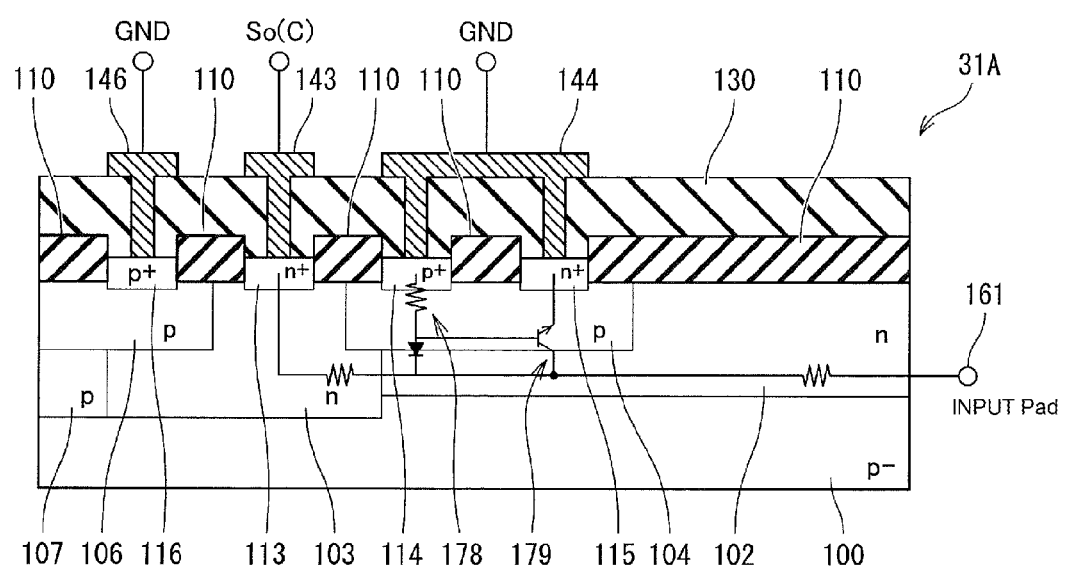
FIG. 4 is a main portion enlarged sectional view of an enlarged part in FIG. 2.

In the semiconductor device 31A according to the first embodiment, as shown in FIG. 4, a parasitic npn bipolar transistor 179 using the n$^+$ type potential extracting region 115 as its emitter, the p type well region 104 as its base, and the n type drift region 102 as its collector is incorporated in a surface layer portion of the semiconductor substrate 100 in the manner of an equivalent circuit. In addition, a parasitic diode 178 using the p type well region 104 as its anode and the n type drift region 102 as its cathode is incorporated in a surface layer portion of the semiconductor substrate 100 in the manner of an equivalent circuit. In the semiconductor device 31A according to the first embodiment, the first JFET 81 and the second JFET 82 are protected from an ESD surge by operation of the parasitic npn bipolar transistor 179.

<Operation of Parasitic Bipolar Transistor>

Figure 5:
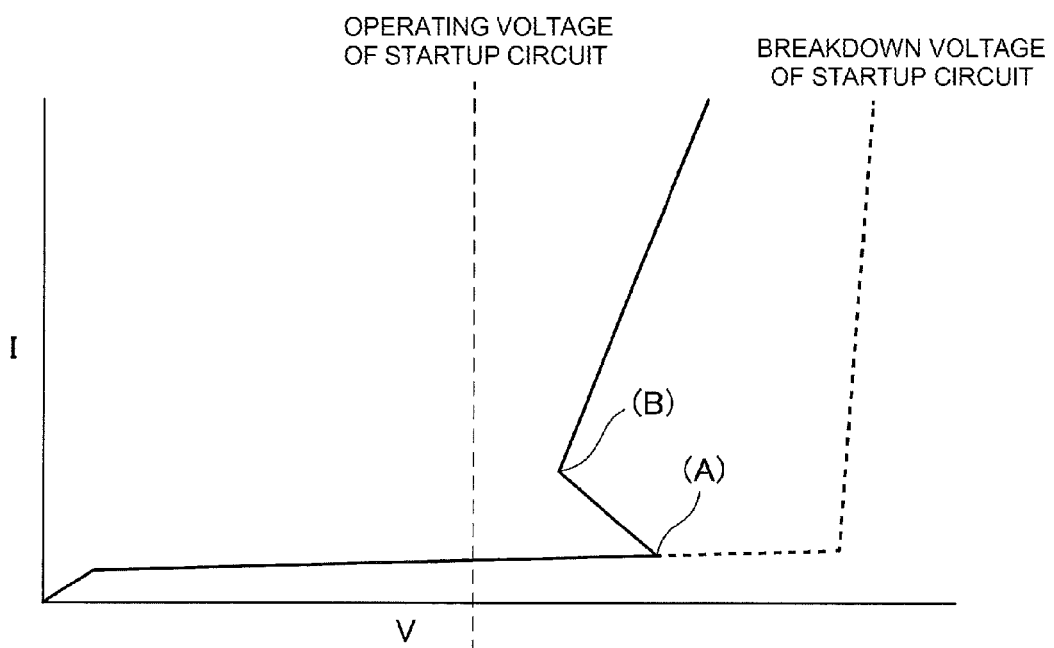
FIG. 5 is an I-V characteristic graph for explaining operation of a parasitic npn bipolar transistor in the semiconductor device according to the first embodiment of the invention.

Next, the operation of the parasitic npn bipolar transistor 179 will be described with reference to FIGS. 4 and 5. As shown in FIG. 2, the semiconductor device 31A is provided with the bonding pad (external input terminal) 161 on the first main electrode region 101, and the bonding pad 161 is electrically connected to the first main electrode region 101. When an ESD surge is applied to the bonding pad 161, the parasitic diode 178 shown in FIG. 4 breaks down (Point (A) in FIG. 5) so that a surge current generated due to the application of the ESD surge flows from the bonding pad 161 into the well region 104 and the well contact region 114 in the surface layer portion of the well region 104 via the first main electrode region 101 and the drift region 102. The current flowing inside the well region 104 serves as a base current to turn on the parasitic npn bipolar transistor 179 shown in FIG. 4 (Point (B) in FIG. 5). When the parasitic npn bipolar transistor 179 turns on, the surge current flows from the drift region 102 into the potential extracting region 115. In other words, the surge current can be extracted from the drift region 102 by the potential extracting region 115. Accordingly, the first JFET 81 and the second JFET 82 (startup element 65a) can be protected from the ESD surge. That is, the well region 104 serves as the base region which controls the current flowing between the potential extracting region 115 and the drift region 102. As a result, the breakdown resistance to ESD in the first JFET 81 and the second JFET 82 can be enhanced so that the reliability of the semiconductor device 31A can be further improved.

In addition, since the potential extracting region 115 is provided in the surface layer portion of the well region 104, the parasitic npn bipolar transistor 179 having a small occupied area can be formed easily. Accordingly, the increase of the size of the semiconductor chip can be suppressed greatly, in comparison with the background-art method in which the planar size of the JFET is increased and the distance between the bonding pad and the source region of the JFET, that is, the length of the drift region, in the planar pattern is increased to improve the breakdown resistance to ESD. Consequently, according to the semiconductor device 31A according to the first embodiment, it is possible to further improve the reliability while suppressing the increase of the chip size. In the semiconductor device 31A according to the first embodiment, equivalent breakdown resistance to ESD can be obtained with a chip size about one 3.7th as large as that in the background-art method in which the length of the drift region 102 is increased to improve the breakdown resistance to ESD.

Incidentally, it is preferable that the parasitic npn bipolar transistor 179 is operated in an operation range which is not lower than the normally used voltage (operating voltage) of the startup posterior stage circuit 65b connected to the second main electrode region (source regions) of the first JFET 81 and the second JFET 82 and which is not higher than the breakdown voltage of the startup posterior stage circuit.

In addition, the impurity concentration of the well region 104 serving as a base resistor is controlled in order to make the operation of the parasitic npn bipolar transistor 179 easy. In addition, the distance between the second main electrode contact region and the potential extracting region is optimized so that the operation of the parasitic npn bipolar transistor 179 can be generated in the outer peripheral portions of the first JFET 81 and the second JFET 82.

The semiconductor device 31A according to the first embodiment has the structure in which the well region 104 and the potential extracting region 115 are formed annularly in peripheral edge portions of the annular drift region 102 shown in FIG. 1. Accordingly, the operating resistance of the parasitic npn bipolar transistor 179 can be reduced and current concentration can be avoided.

Second Embodiment

A semiconductor device 31B according to a second embodiment of the invention has substantially the same configuration as the semiconductor device 31A according to the first embodiment except the structure of JFETs. The semiconductor device 31B according to the second embodiment will be described below with reference to FIGS. 8 to 14.

Figure 8:
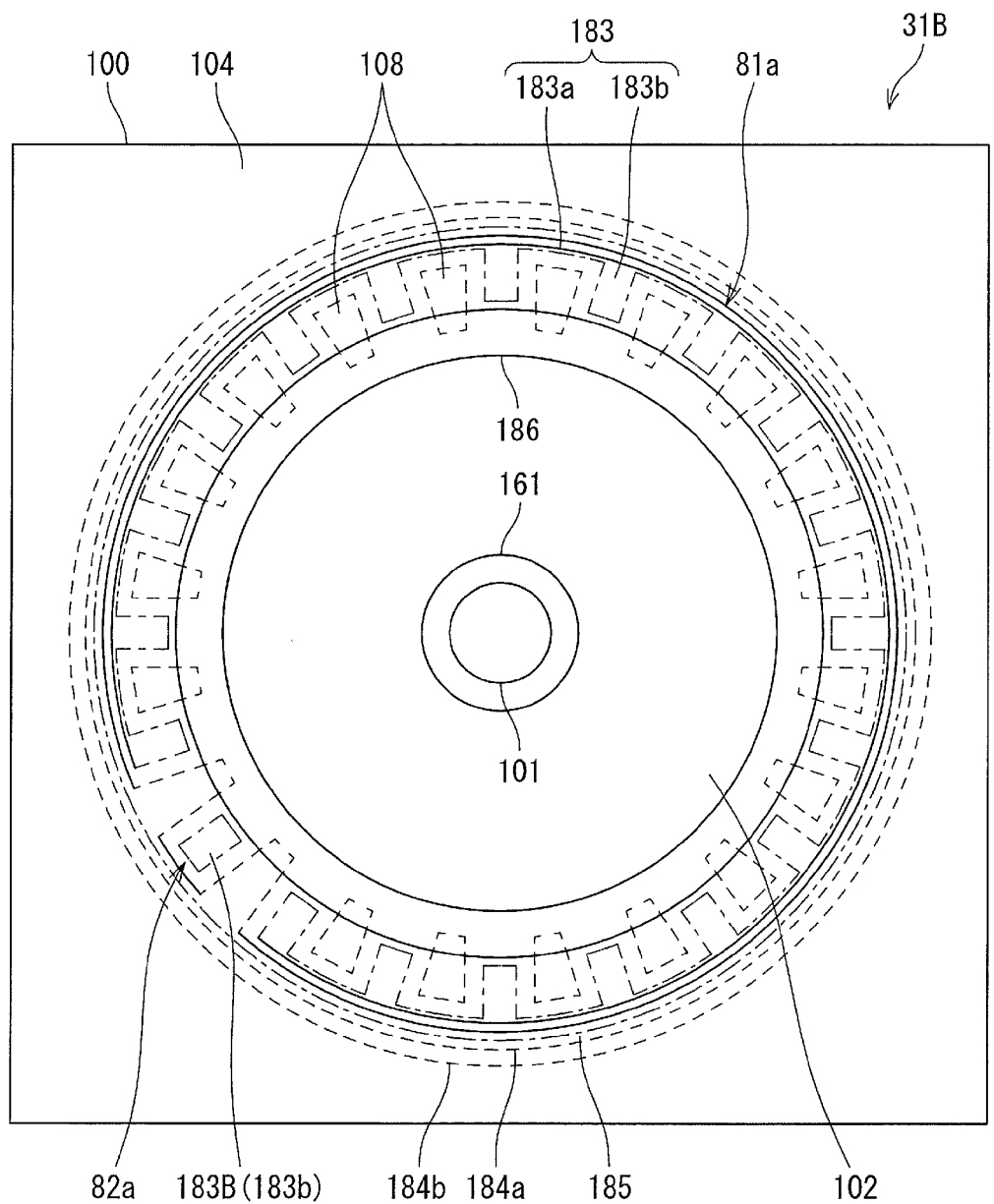
FIG. 8 is a main portion plan view schematically showing the configuration of a semiconductor device according to a second embodiment of the invention.
Figure 9:
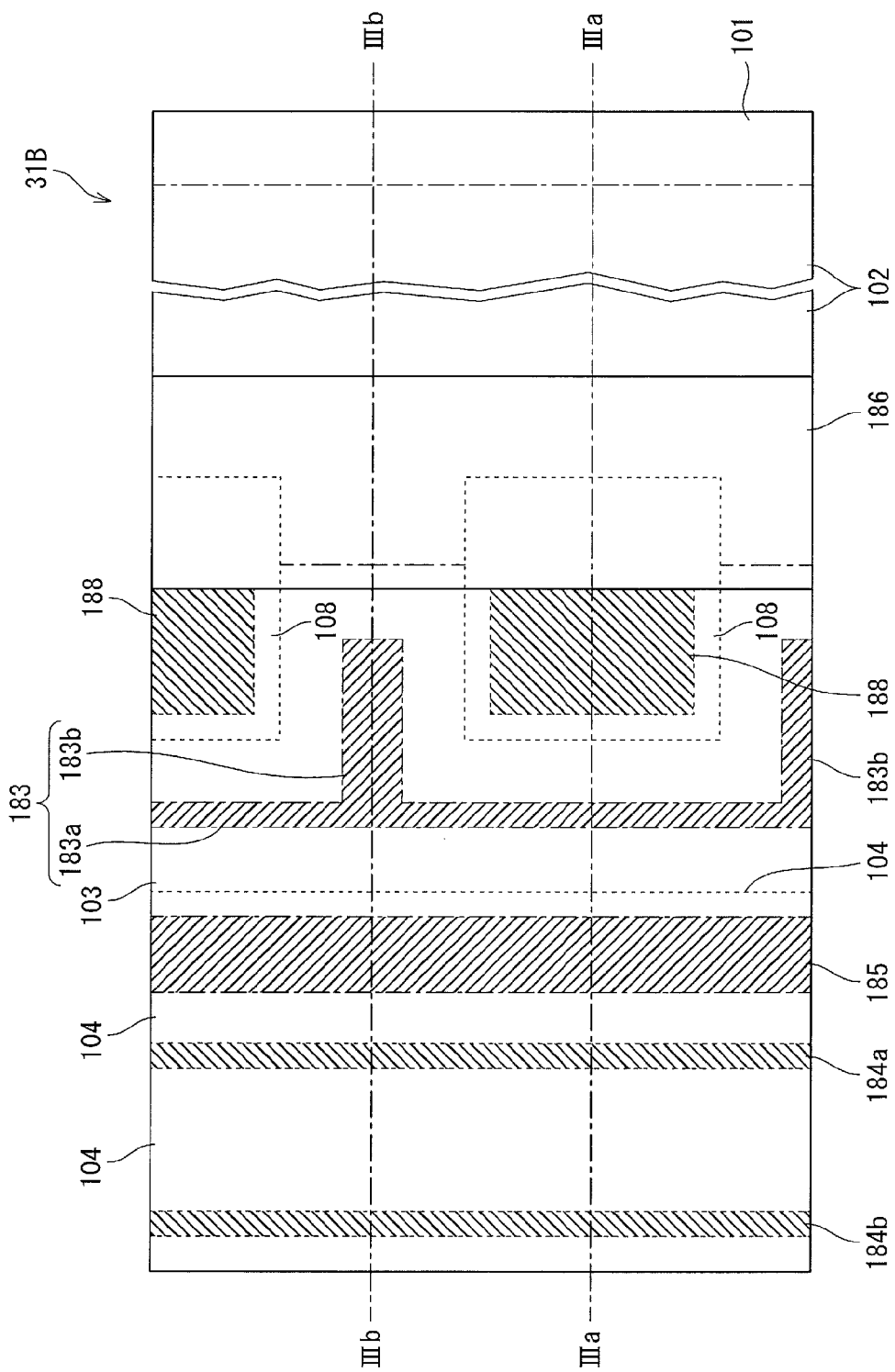
FIG. 9 is a main portion enlarged plan view showing an enlarged part of a region where a first JFET shown in FIG. 8 is formed.

As shown in FIGS. 8 and 9, the semiconductor device 31B according to the second embodiment is mainly constituted by a second conductive type (p⁻ type) semiconductor substrate 100. A first JFET 81a and a second JFET 82a in place of the first JFET 81 and the second JFET 82 constituting the parts of the startup circuit 41 shown in FIG. 7 are formed in main surface-side surface layer portions of the semiconductor substrate 100. Also in the second embodiment, the first JFET 81a and the second JFET 82a have substantially the same configurations. Accordingly, description will be made in focus on the first JFET 81a while description about the second JFET 82a will be omitted.

As shown in FIG. 8, the first JFET 81a has a first conductive type (n type) first main electrode region (drain region) 101 provided in the center of the semiconductor substrate 100. The first main electrode region 101 is illustrated in the right end in the plan view of FIG. 9 and the sectional views of FIGS. 10 and 11. However, the semiconductor device 31B according to the second embodiment is provided with the first main electrode region 101, a second conductive type (p type) drift region 102, and a first conductive type (n type) second main electrode region (source region) 103. In addition, as shown in FIGS. 8 to 11, the first JFET 81a is provided with a second conductive type (p type) well region 104, second conductive type (p type) high breakdown voltage well regions 108, a second conductive type (p type) embedded region 107, and second conductive type (p type) high breakdown voltage embedded regions 109.

Figure 10:
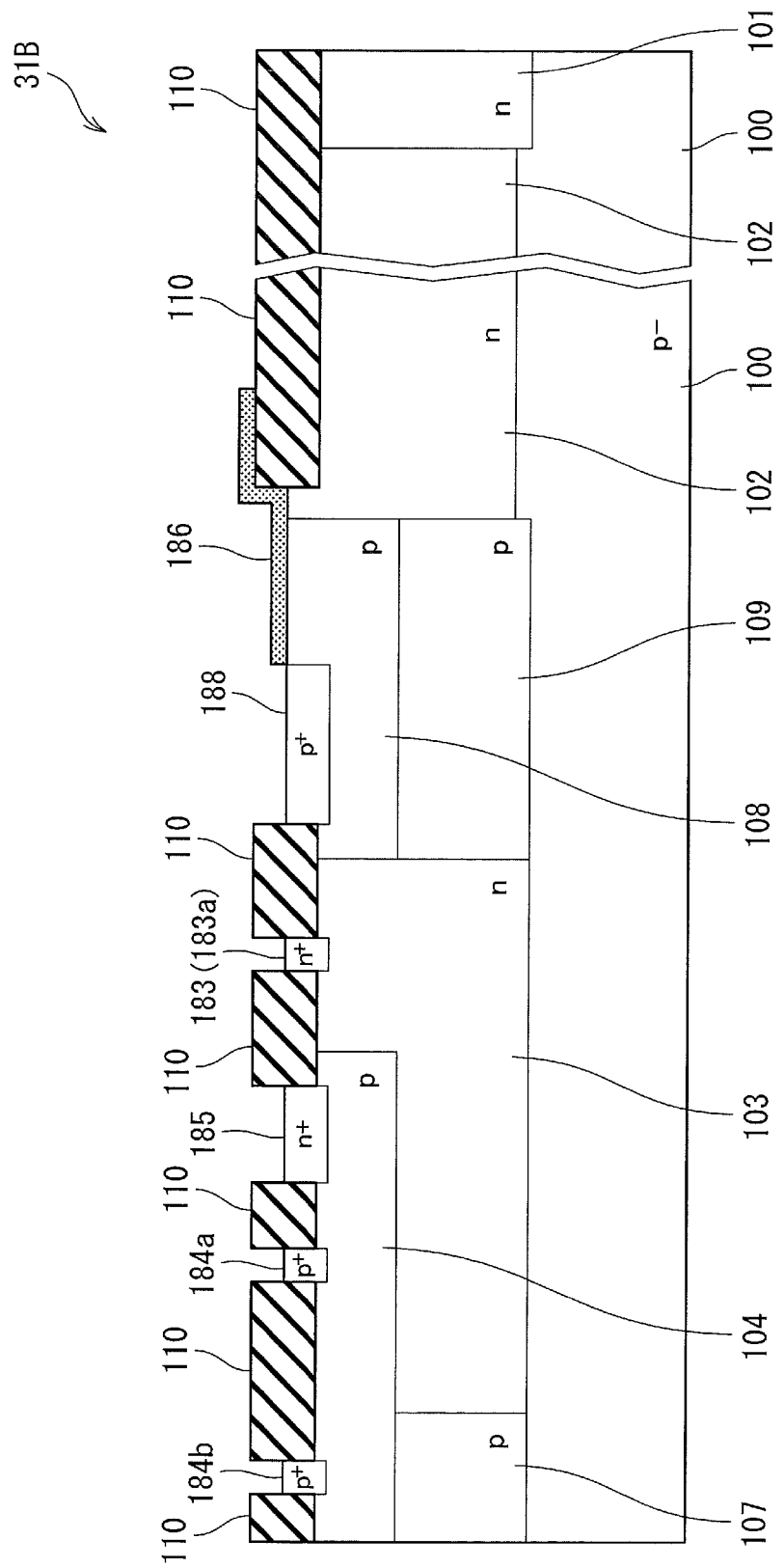
FIG. 10 is a sectional view showing the sectional structure taken along a line IIIa-IIIa in FIG. 9.
Figure 11:
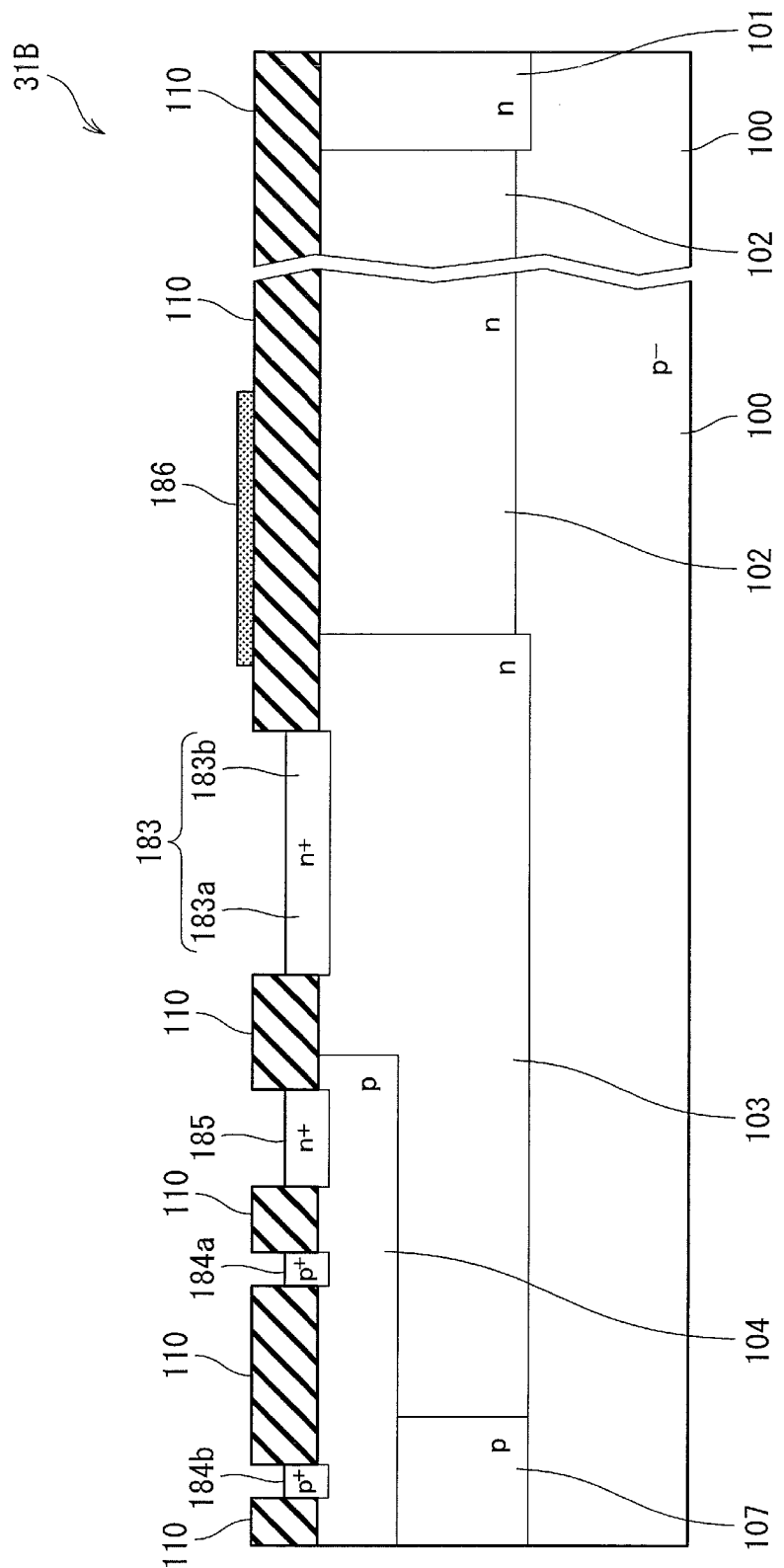
FIG. 11 is a sectional view showing the sectional structure taken along a line IIIb-IIIb in FIG. 9.

As shown in FIGS. 10 and 11, the first main electrode region 101 is provided in a main surface-side surface layer portion of the semiconductor substrate 100. The drift region 102 is provided in a main surface-side surface layer portion of the semiconductor substrate 100 so as to make contact with the first main electrode region 101 in a position surrounding the first main electrode region 101. In FIGS. 10 and 11, the second main electrode region 103 is only illustrated in a place corresponding to the left half of FIG. 8. However, as apparent from FIG. 8, the second main electrode region 103 is provided in a main surface-side surface layer portion of the semiconductor substrate 100 so as to make contact with the drift region 102 in a position surrounding the drift region 102.

The well region 104 is provided in a surface layer portion of the drift region 102. The high breakdown voltage well regions 108 are provided in main surface-side surface layer portions of the semiconductor substrate 100 so as to be separated from the well region 104 in positions surrounding the drift region 102. The embedded region 107 is provided between the well region 104 and the semiconductor substrate 100 so as to make contact with the well region 104 and the semiconductor substrate 100. The high breakdown voltage embedded regions 109 are provided between the high breakdown voltage well regions 108 and the semiconductor substrate 100 so as to make contact with the high breakdown voltage well regions 108 and the semiconductor substrate 100.

The first JFET 81a is provided with a first conductive type (n⁺ type) first main electrode contact region (not shown) which is selectively provided in a surface layer portion of the first main electrode region 101, a first conductive type (n⁺ type) second main electrode contact region 183 which is selectively provided in a surface layer portion of the second main electrode region 103, a second conductive type (p⁺ type) first well contact region 184a and a second conductive type (p⁺ type) second well contact region 184b which are selectively provided in surface layer portions of the well region 104, a first conductive type (n⁺ type) potential extracting region 185 which is selectively provided in a surface layer portion of the well region 104, and second conductive type (p⁺ type) high breakdown voltage well contact regions 188 which are selectively provided in surface layer portions of the high breakdown voltage well regions 108.

The first main electrode contact region is formed with a higher impurity concentration than that of the first main electrode region 101. The second main electrode contact region 183 is formed with a higher impurity concentration than that of the second main electrode region 103. Each of the first well contact region 184a, the second well contact region 184b and the potential extracting region 185 is formed with a higher impurity concentration than that of the well region 104. Each of the high breakdown voltage well contact regions 188 is formed with a higher impurity concentration than each of the high breakdown voltage well regions 108. The drift region 102 is formed with a lower impurity concentration than that of each of the first main electrode region 101 and the second main electrode region 103.

As shown in FIGS. 8 and 9, each of the second main electrode contact region 183, the first well contact region 184a, the second well contact region 184b and the potential extracting region 185 is formed annularly in a position surrounding the first main electrode region 101. In addition, although not shown in detail, each of the drift region 102, the second main electrode region 103, the well region 104, the embedded region 107 is also formed annularly in a position surrounding the first main electrode region 101.

As shown in FIGS. 10 and 11, the well region 104 is formed in a surface layer portion of the second main electrode region 103 so as to be separated from the drift region 102 and the high breakdown voltage well regions 108. In addition, the well region 104 is formed to be shallower than the drift region 102 and the second main electrode region 103.

As shown in FIGS. 8 to 11, the second main electrode contact region 183 is formed into a planar pattern shape having an annular portion 183a and a plurality of protruding portions 183b. The annular portion 183a is formed annularly so as to surround the drift region 102. The protruding portions 183b protrude from the annular portion 183a toward the drift region 102. The protruding portions 183b are disposed with the shapes of dots at predetermined intervals in an annular direction of the annular portion 183a.

The high breakdown voltage well regions 108 and the high breakdown voltage embedded regions 109 are disposed with a pattern in which they are shaped like dots continuous in a circumferential direction of the second main electrode region 103 and the second main electrode contact region 183. In addition, each of the high breakdown voltage well regions 108 and the high breakdown voltage embedded regions 109 is disposed between adjacent ones of the protruding portions 183b of the second main electrode contact region 183 in the circumferential direction of the second main electrode region 103 and the second main electrode contact region 183.

Although not shown in detail, the second main electrode region (source region) 103 is divided into two in a similar manner as that in the aforementioned first embodiment. Of the two, one second main electrode region 103 belongs to the first JFET 81a, and the other second main electrode region 103B (see FIG. 12) belongs to the second JFET 82a. That is, the second main electrode region 103B of the second JFET 82a is separated from the second main electrode region 103 of the first JFET 81a.

The second main electrode contact region 183 is divided into two in a similar manner to that in the aforementioned first embodiment. Of the two, one second main electrode contact region 183 belongs to the first JFET 81a, and the other second main electrode contact region 183B (see FIG. 12) belongs to the second JFET 82a.

Figure 12:
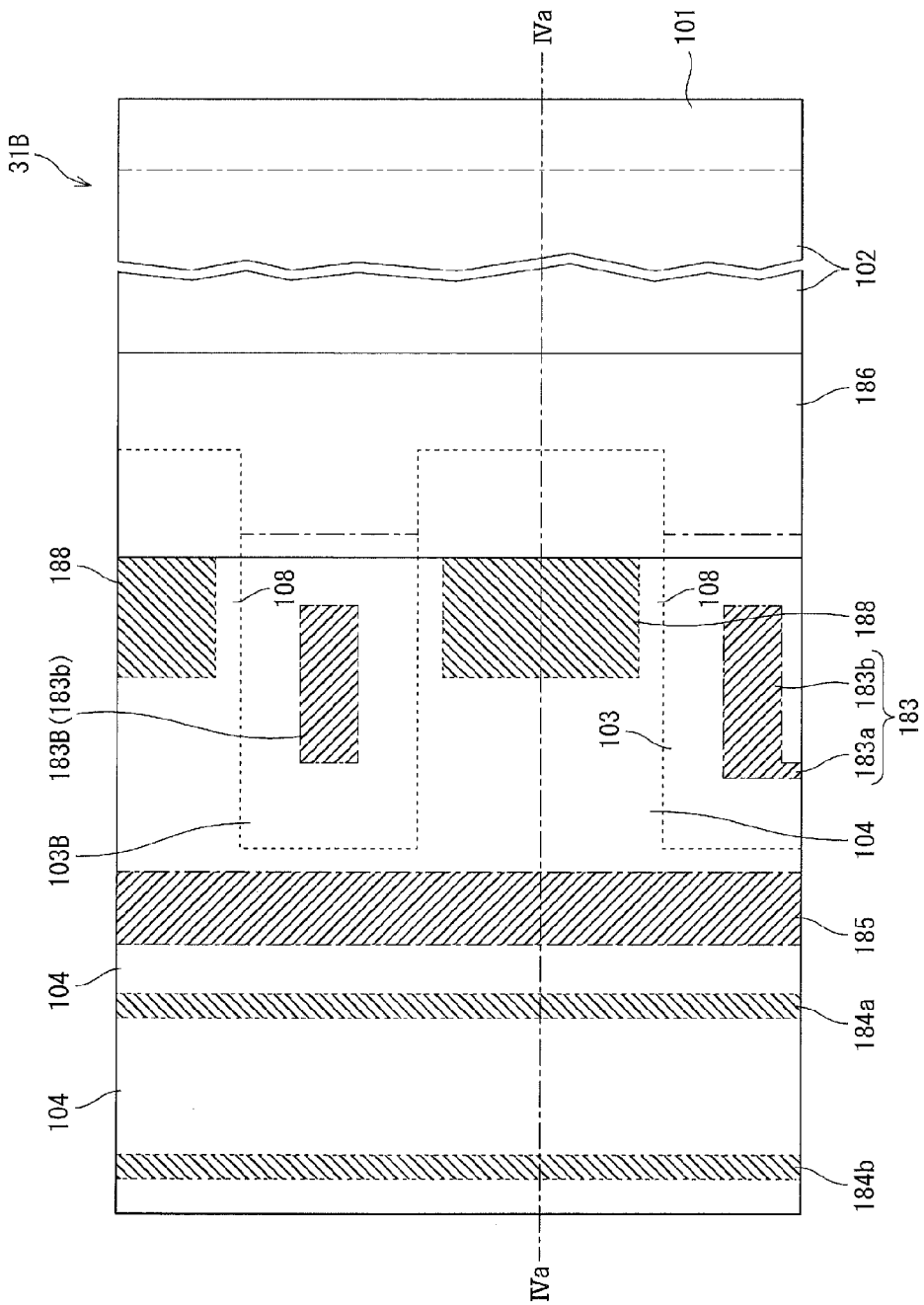
FIG. 12 is a main portion enlarged plan view showing an enlarged part of a region where a second JFET shown in FIG. 8 is formed.

As shown in FIGS. 8 and 9, the second main electrode contact region 183 of the first JFET 81a is constituted by the annular portion 183a and the protruding portions 183b. On the other hand, as shown in FIGS. 8 and 12, the second main electrode contact region 183B of the second JFET 82a is constituted by a single protruding portion 183b. As shown in FIG. 12, the second main electrode contact region 183B (the single protruding portion 183b) of the second JFET 82a is separated from the second main electrode contact region 183 (the annular portion 183a and the protruding portions 183b) of the first JFET 81a.

Although not shown in detail, the well region 104 and the embedded region 107 are formed in the outside of the second main electrode region 103 so as to surround the second main electrode region 103.

Figure 13:
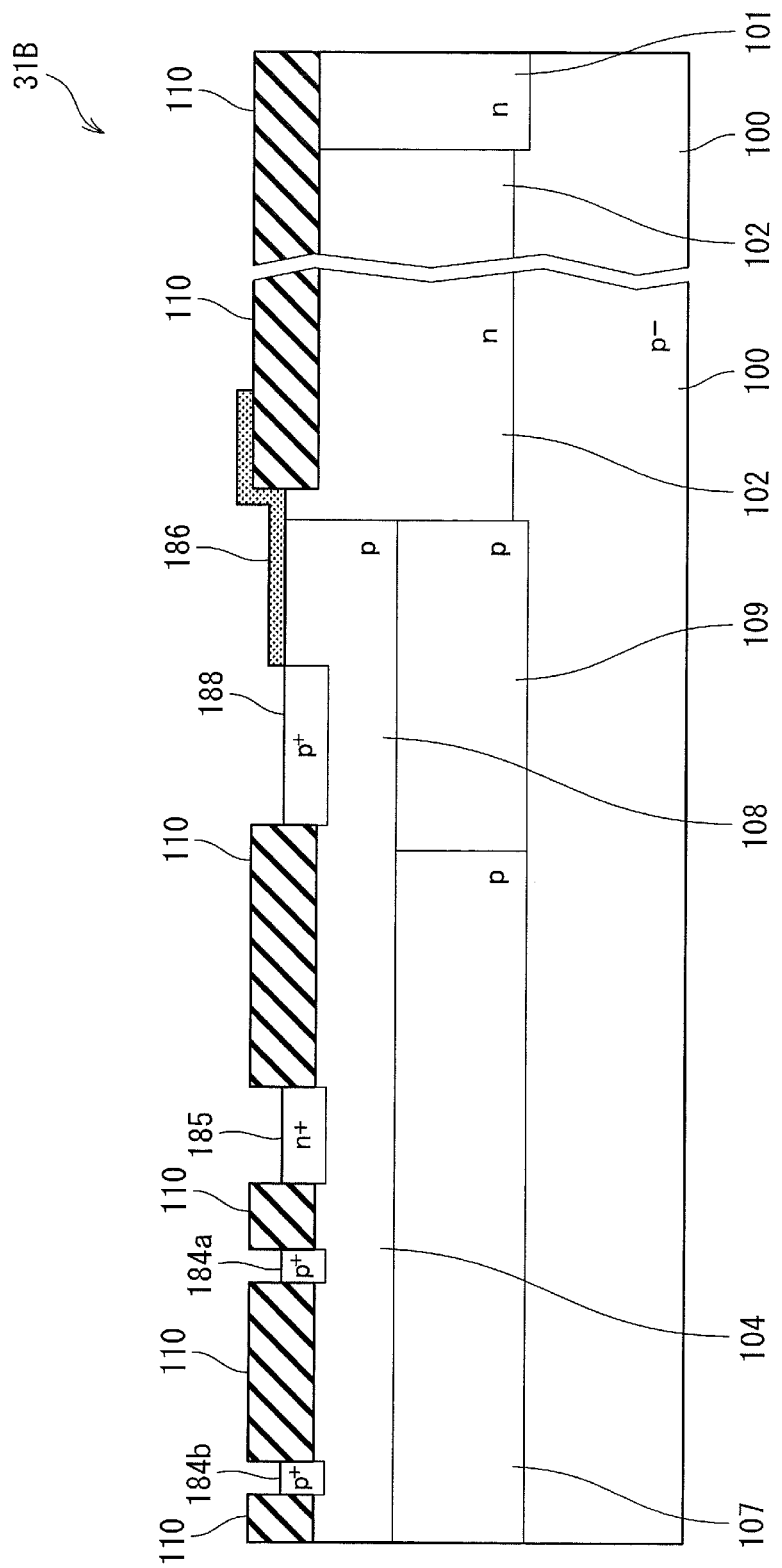
FIG. 13 is a sectional view showing the sectional structure taken along a line IVa-IVa in FIG. 12.

As shown in FIGS. 12 and 13, the well region 104 is consecutively connected to the high breakdown voltage well regions 108 through notches of the second main electrode regions 103 and 103B and the second main electrode contact regions 183 and 183B so as to be electrically connected to the high breakdown voltage well regions 108. The well region 104 and the high breakdown voltage well regions 108 are formed collectively with the same mask pattern in an impurity introducing step in a semiconductor device manufacturing process. In addition, as shown in FIG. 13, the embedded region 107 is also consecutively connected to the high breakdown voltage embedded regions 109 through the notches of the second main electrode regions 103 and 103B and the second main electrode contact regions 183 and 183B so as to be electrically connected to the high breakdown voltage embedded regions 109.

A field insulating film 110 which is, for example, made of a silicon dioxide film is formed selectively in a main surface of the semiconductor substrate 100. In addition, a field plate 186 is provided on the main surface of the semiconductor substrate 100. The field plate 186 is formed annularly so as to surround the first main electrode region 101. The field plate 186 is formed on the field insulating film 110 so as to extend therefrom onto the high breakdown voltage well regions 108 in its width direction. For example, the field plate 186 is made of a polycrystalline silicon film.

The first main electrode region (drain region) 101 is electrically connected to a bonding pad (external input terminal) 161 to which a potential is applied from the outside. The bonding pad 161 is disposed on the first main electrode region 101.

The second main electrode region 103 and the second main electrode contact region 183 are electrically connected to the startup posterior stage circuit 65b shown in FIG. 6. A ground potential is applied to the well region 104, the first well contact region 184a, the second well contact region 184b, and the potential extracting region 185. The ground potential is applied to the semiconductor substrate 100.

As shown in FIGS. 9 and 10, in the first JFET 81a and the second JFET 82a (active element 65a), the junction between the high breakdown voltage well regions 108 with the high breakdown voltage embedded regions 109 and the drift region 102 plays a role as the structure for increasing the breakdown voltage and the second main electrode region (source region) 103 in a peripheral portion plays a role as the structure for large current. Due to the role sharing, the first JFET 81a and the second JFET 82a can make the increase of the breakdown voltage and the reduction of the on-resistance compatible.

When a voltage is applied to the first main electrode region (drain region) 101, a drain current flows radially from the first main electrode region 101 shown in the center of FIG. 8 toward the second main electrode region 103 surrounding the first main electrode region 101. When the second main electrode region 103 is biased toward a positive potential and the potential increases and reaches a certain potential, the drift region 102 is cut off by a depletion layer so that the drain current can be blocked. In the second embodiment, for example, the breakdown voltage between the drain and the source is designed to be not lower than 500 V mainly due to the junction between the high breakdown voltage well regions 108 with the high breakdown voltage embedded regions 109 and the drift region 102.

Figure 14:
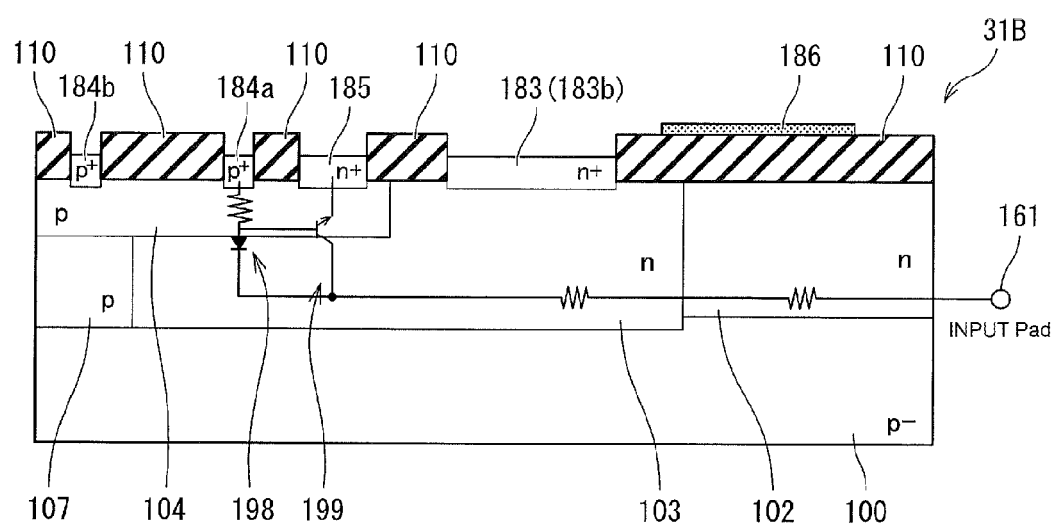
FIG. 14 is a main portion enlarged sectional view showing an enlarged part in FIG. 11.

In the semiconductor device 31B according to the second embodiment, as shown in FIG. 14, a parasitic npn bipolar transistor 199 using the $n^+$ type potential extracting region 185 as its emitter, the p type well region 104 as its base, and the n type drift region 102 as its collector is incorporated in a surface layer portion of the semiconductor substrate 100 in the manner of an equivalent circuit. In addition, a parasitic diode 198 using the p type well region 104 as its anode and the n type drift region 102 as its cathode is incorporated in a surface layer portion of the semiconductor substrate 100 in the manner of an equivalent circuit. In the semiconductor device 31B according to the second embodiment, the first JFET 81a and the second JFET 82a are protected from an ESD surge by operation of the parasitic npn bipolar transistor 199 in the same manner as in the first embodiment.

<Operation of Parasitic Bipolar Transistor>

Next, the operation of the parasitic npn bipolar transistor 199 will be described with reference to FIGS. 14 and 5. As shown in FIG. 8, the semiconductor device 31B is provided with the bonding pad (external input terminal) 161 on the first main electrode region 101, and the bonding pad 161 is electrically connected to the first main electrode region 101. When an ESD surge is applied to the bonding pad 161, the parasitic diode 198 shown in FIG. 14 breaks down (Point (A) in FIG. 5) so that a surge current generated due to the application of the ESD surge flows from the bonding pad 161 into the well region 104 and the first well contact region 184a in the surface layer portion of the well region 104 via the first main electrode region 101, the drift region 102 and the second main electrode region 103. The current flowing inside the well region 104 serves as a base current to turn on the parasitic npn bipolar transistor 199 shown in FIG. 14 (Point (B) in FIG. 5). When the parasitic npn bipolar transistor 199 turns on, the surge current flows from the second main electrode region 103 into the potential extracting region 185. In other words, the surge current can be extracted from the second main electrode region 103 by the potential extracting region 185. Accordingly, the first JFET 81a and the second JFET 82a (startup element 65a) can be protected from the ESD surge in the same manner as in the first embodiment. That is, the well region 104 serves as the base region which controls the current flowing between the potential extracting region 185 and the drift region 102. Accordingly, also in the semiconductor device 31B according to the second embodiment, it is possible to further improve the reliability while suppressing the increase of the chip size in the same manner as in the first embodiment.

The invention developed by the present inventor has been described specifically based on the aforementioned embodiments. However, it is a matter of course that the invention is not limited to the aforementioned embodiments but may be changed variously without departing from the spirit and scope of the invention. For example, the second main electrode region (source region) 103 in each of the semiconductor devices 31A and 31B is divided in two in the aforementioned embodiments. It is a matter of course that the second main electrode region (source region) 103 may be divided into three or more. In addition, the second main electrode region (source region) 103 may be provided as one region without being divided.

What is claimed is:

1. A semiconductor device comprising:
   a first conductive type first main electrode region;
   a first conductive type drift region which makes contact with the first conductive type first main electrode region;
   a first conductive type second main electrode region which makes contact with the first conductive type drift region;
   a second conductive type well region which is provided in a part of a surface layer portion of the first conductive type drift region and to which a reference potential is applied; and
   a first conductive type potential extracting region which is provided in a surface layer portion of the second conductive type well region and to which the reference potential is applied; wherein:
   the second conductive type well region serves as a base region which controls a current flowing between the first conductive type potential extracting region and the first conductive type drift region;
   the first conductive type drift region is disposed so as to surround a peripheral portion of the first conductive type first main electrode region; and
   the first conductive type second main electrode region is disposed so as to surround a peripheral portion of the first conductive type drift region.

2. The semiconductor device according to claim 1, wherein:
   the second conductive type well region and the first conductive type potential extracting region are formed annularly in positions surrounding the first conductive type first main electrode region.

3. The semiconductor device according to claim 1, wherein:
   the second conductive type well region is provided to extend from the first conductive type drift region onto the first conductive type second main electrode region and is shallower than the first conductive type drift region and the first conductive type second main electrode region.

4. The semiconductor device according to claim 1, wherein:
   the first conductive type second main electrode region is formed annularly in a position surrounding the first conductive type first main electrode region.

5. The semiconductor device according to claim 1, wherein:
   the second conductive type well region is provided separately from the first conductive type drift region and is shallower than the first conductive type drift region and the first conductive type second main electrode region.

6. The semiconductor device according to claim 1, further comprising:
   a plurality of first conductive type high breakdown voltage well regions which are disposed in a pattern in which the first conductive type high breakdown voltage well regions are shaped like dots continuous in a circumferential direction of the first conductive type second main electrode region in surface layer portions of the first conductive type drift region and the first conductive type second main electrode region.

7. A semiconductor device comprising:
   a first conductive type first main electrode region;
   a first conductive type drift region which makes contact with the first conductive type first main electrode region;
   a first conductive type second main electrode region which makes contact with the first conductive type drift region;
   a second conductive type well region which is provided in a part of a surface layer portion of the first conductive type second main electrode region and to which a reference potential is applied; and
   a first conductive type potential extracting region which is provided in a surface layer portion of the second conductive type well region and to which the reference potential is applied; wherein:
   the second conductive type well region serves as a base region which controls a current flowing between the first conductive type potential extracting region and the first conductive type second main electrode region;
   the first conductive type drift region is disposed so as to surround a peripheral portion of the first conductive type first main electrode region; and
   the first conductive type second main electrode region is disposed so as to surround a peripheral portion of the first conductive type drift region.

8. The semiconductor device according to claim 7, wherein:
   the second conductive type well region and the first conductive type potential extracting region are formed annularly in positions surrounding the first conductive type first main electrode region.

9. The semiconductor device according to claim 7, wherein:
   the first conductive type second main electrode region is provided annularly in a position surrounding the first conductive type first main electrode region.

* * * * *